United States Patent
Huang et al.

(10) Patent No.: US 7,924,565 B2
(45) Date of Patent: Apr. 12, 2011

(54) HEAT DISSIPATION STRUCTURE FOR COMMUNICATION CHASSIS

(75) Inventors: Chiu-Mao Huang, Sinjhuang (TW); Chang-Mou Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 59 days.

(21) Appl. No.: 12/464,287

(22) Filed: May 12, 2009

(65) Prior Publication Data

US 2010/0290189 A1    Nov. 18, 2010

(51) Int. Cl.
*H05K 7/20* (2006.01)
*G06F 1/20* (2006.01)

(52) U.S. Cl. .............. 361/700; 361/679.47; 361/679.52; 361/679.54; 361/703; 361/704; 361/719; 361/720; 361/721; 165/185; 174/15.2; 174/547; 174/548

(58) Field of Classification Search ............. 361/679.47, 361/679.52, 679.54, 700, 703–704, 715–716, 361/720–721, 719; 165/80.4, 104.33, 185; 174/15.2, 526, 547–548
See application file for complete search history.

(56) References Cited

U.S. PATENT DOCUMENTS

| 5,398,161 | A | 3/1995 | Roy |
| 6,373,700 | B1 * | 4/2002 | Wang ............................ 361/698 |
| 7,130,193 | B2 * | 10/2006 | Hirafuji et al. ................ 361/700 |
| 7,304,846 | B2 * | 12/2007 | Wang et al. .................... 361/700 |
| 7,342,788 | B2 * | 3/2008 | Nikfar ............................ 361/700 |
| 7,385,820 | B1 * | 6/2008 | Chen .............................. 361/704 |
| 2006/0246952 | A1 | 11/2006 | Widmayer et al. |
| 2007/0263355 | A1 * | 11/2007 | Yu et al. ......................... 361/700 |
| 2008/0013283 | A1 * | 1/2008 | Gilbert et al. ................. 361/715 |
| 2010/0208428 | A1 * | 8/2010 | Huang et al. .................. 361/700 |
| 2010/0208430 | A1 * | 8/2010 | Huang et al. .................. 361/709 |

FOREIGN PATENT DOCUMENTS

| CN | 201341296 Y | * | 11/2009 |
| DE | 202009006516 U1 | * | 9/2009 |
| JP | 3151606 U | * | 7/2009 |
| JP | 3152577 U | * | 8/2009 |

* cited by examiner

*Primary Examiner* — Robert J Hoffberg

(57) ABSTRACT

A heat dissipation structure for communication chassis. The heat dissipation structure includes an enclosure. At least one first copper heat absorption component and at least one first heat pipe assembly are disposed in the enclosure. The first heat pipe assembly is connected with the first copper heat absorption component and a section not in contact with the first copper heat absorption component. The first heat pipe assembly serves to quickly transfer heat absorbed by the first copper heat absorption component to the section not in contact with the first copper heat absorption component to dissipate the heat.

15 Claims, 6 Drawing Sheets

HEAT DISSIPATION STRUCTURE FOR COMMUNICATION CHASSIS

FIELD OF THE INVENTION

The present invention relates generally to a heat dissipation structure for communication chassis, and more particularly to an improved heat dissipation structure for communication chassis, which includes at least one first copper heat absorption component and at least one first heat pipe assembly. The first heat pipe assembly serves to transfer heat absorbed by the first copper heat absorption component to a section not in contact with the first copper heat absorption component so as to quickly dissipate the heat.

BACKGROUND OF THE INVENTION

It is known that the conventional electronic communication equipments are enclosed in a communication chassis. When operating, the electronic communication equipments generate high heat. The communication chassis is a closed cabinet, which is generally made of metal material by once casting. Owing to the limitation of the current casting technique, the material of the communication chassis has low thermal conductivity. As a result, the heat generated by the electronic communication equipments will be absorbed by the communication chassis to locally accumulate in certain areas of the interior of the communication chassis. The interior of the communication chassis has very low temperature uniformity so that the heat is hard to dissipate. That is, the temperature in those areas in contact with the electronic communication equipments is relatively high, while the temperature of other areas distal from the electronic communication equipments is much lower than the temperature of the areas in contact with the electronic communication equipments. In the case that the temperature rises to a value beyond a tolerable range, the reliability and lifetime of the electronic communication equipments will be significantly affected.

Currently, a solution to the above problem is to enlarge the dimension of the communication chassis or improve the performances of the material of the communication chassis. However, such solution results in another problem of heavy weight of the communication chassis.

Therefore, it has become an important topic how to quickly dissipate heat from the communication chassis at high efficiency under the precondition of not changing the dimension and weight of the communication chassis.

FIG. 1 is a perspective exploded view of a conventional communication chassis. As shown in FIG. 1, the communication chassis includes an enclosure 10, a cover body 11, two support posts 12 and a chassis board 13. The enclosure 10 has a receiving space 101 and multiple radiating fins 103 disposed on an outer face of the enclosure 10 opposite to the receiving space 101. The support posts 12 are disposed in one end of the receiving space 101 to string the chassis board 13. The cover body 11 is capped on one end of the enclosure 10 to seal the receiving space 101, whereby the cover body 11 and the enclosure 10 together define a closed space.

When the chassis board 13 positioned in the communication chassis operates, multiple heat-generating components 131, (such as chips, CPU or other ICs), arranged on the chassis board 13 will generate high heat. Only minor part of the heat is transferred to the enclosure 10 and then dissipated to outer side by the radiating fins 103 simply by way of radiation, while major part of the heat remains in the closed receiving space 101 and is hard to dissipate quickly. No heat transfer medium, such as heat pipe or heat conduction element, is provided for the heat-generating components 131 of the chassis board 13. Therefore, the heat generated by the heat-generating components 131 can be hardly immediately transferred to the radiating fins 103 to dissipate the heat. As a result, in operation, the temperature in the communication chassis often rises quickly to result in poor quality of communication signals or even crash of the heat-generating components 131. In some more serious cases, the heat-generating components 131 may damage before its lifetime expires. According to the aforesaid, the conventional communication chassis has the following defects:

1. The conventional communication chassis has poor heat dissipation effect.
2. The communication equipments arranged in the conventional communication chassis are likely to crash.
3. The temperature in the conventional communication chassis often rises to result in poor quality of communication signals.
4. The lifetime of the communication equipments arranged in the conventional communication chassis is shortened.
5. The damage ratio of the communication equipments arranged in the conventional communication chassis is higher.

SUMMARY OF THE INVENTION

A primary object of the present invention is to provide an improved heat dissipation structure for communication chassis, which includes at least one first copper heat absorption component and at least one first heat pipe assembly. The first heat pipe assembly serves to transfer heat absorbed by the first copper heat absorption component to a section not in contact with the first copper heat absorption component to quickly dissipate the heat.

A further object of the present invention is to provide the above improved heat dissipation structure for communication chassis, which has excellent heat dissipation effect.

A still further object of the present invention is to provide the above improved heat dissipation structure for communication chassis, which prolongs the lifetime of the equipments arranged in the communication chassis.

A still further object of the present invention is to provide the above improved heat dissipation structure for communication chassis, which ensures stable quality of communication signals.

A still further object of the present invention is to provide the above improved heat dissipation structure for communication chassis, which provides increased heat dissipation area for more uniformly and quickly dissipating the heat.

According to the above objects, the heat dissipation structure for communication chassis of the present invention includes an enclosure having at least one first copper heat absorption component and at least one first heat pipe assembly. The first copper heat absorption component and the first heat pipe assembly are disposed in the enclosure. The first heat pipe assembly is connected with the first copper heat absorption component and a section not in contact with the first copper heat absorption component. The first heat pipe assembly includes multiple first heat pipes each having at least one first heat absorption end and at least one first heat dissipation end. The first heat absorption end transfers the heat absorbed by the first copper heat absorption component to the first heat dissipation end. The first heat dissipation end then transfers the heat to the section not in contact with the first copper heat absorption component to dissipate the heat.

Accordingly, the heat can be quickly and uniformly distributively transferred to the enclosure for dissipating the heat at high efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
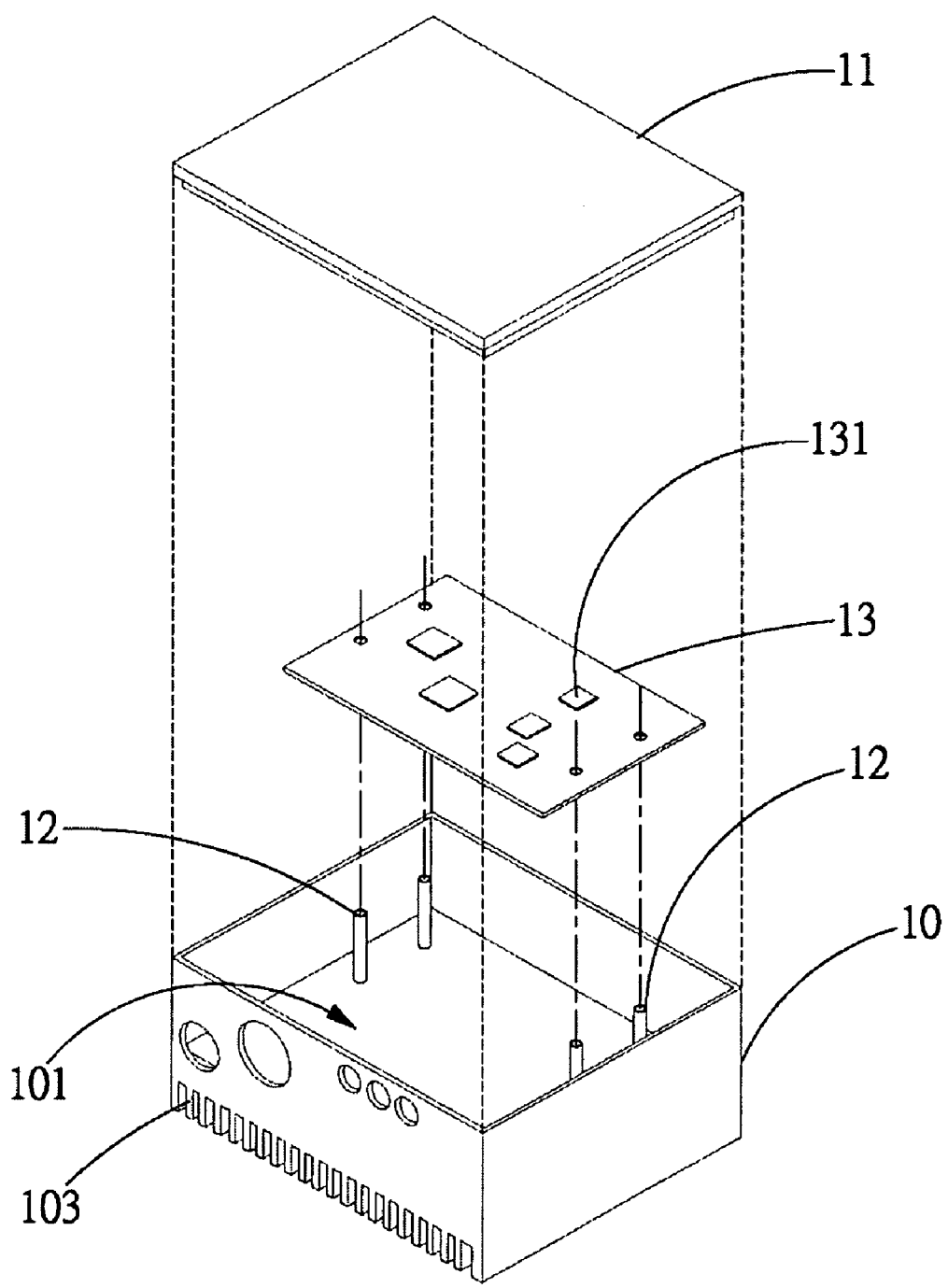
FIG. 1 is a perspective exploded view of a conventional communication chassis.
Figure 2:
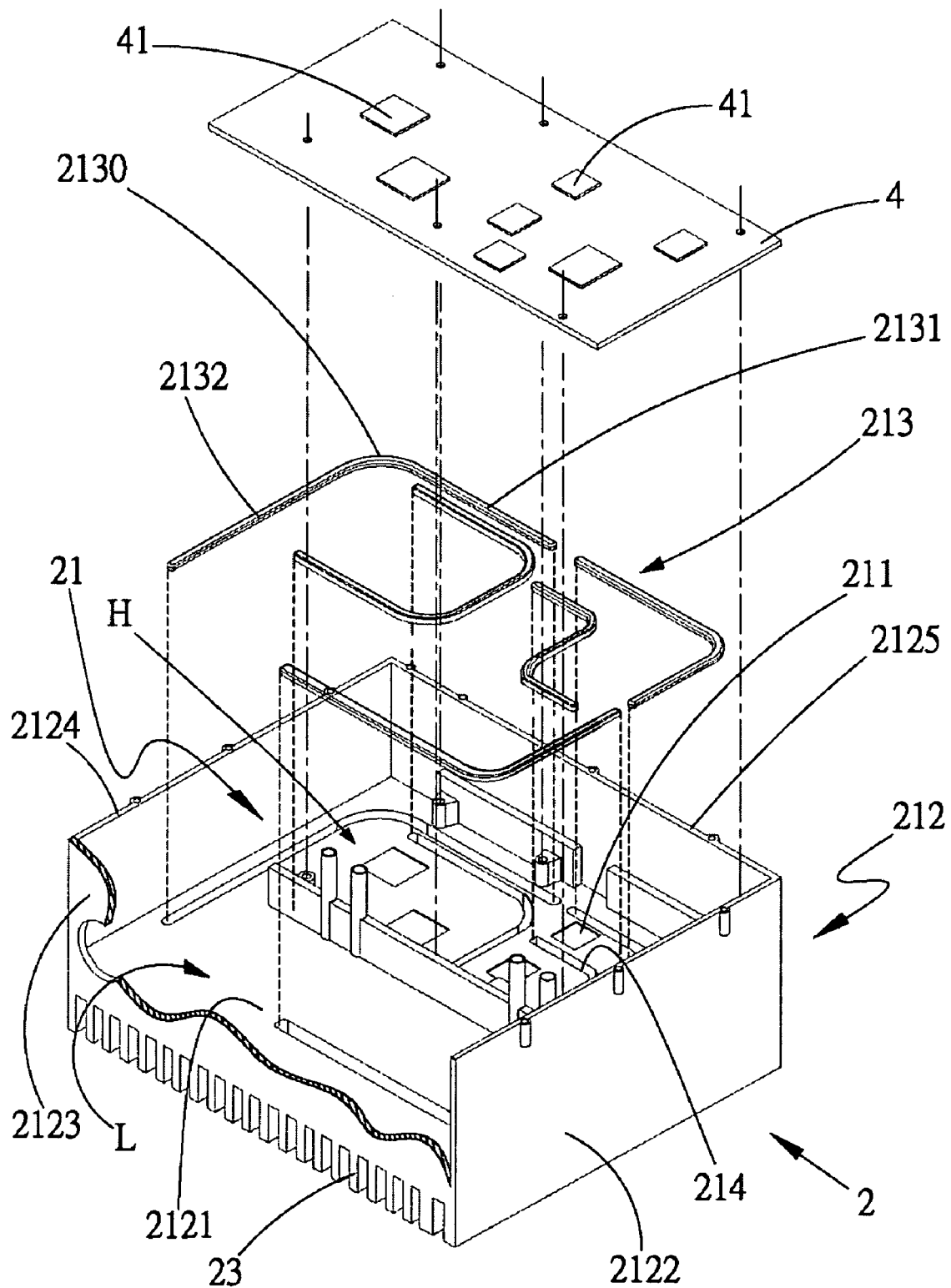
FIG. 2 is a perspective exploded view of the enclosure, the heat pipes and the chassis boards of the present invention.
Figure 3:
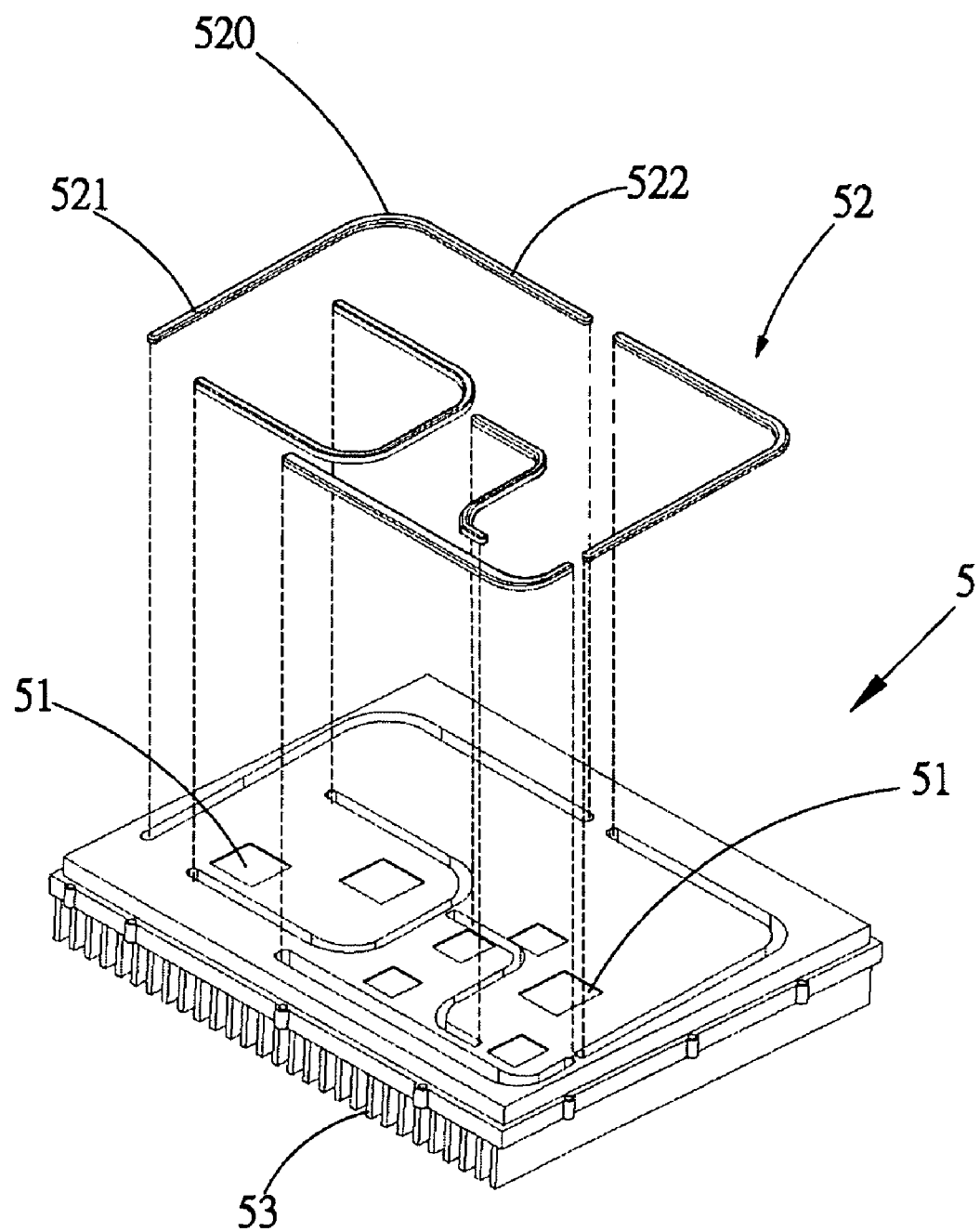
FIG. 3 is a perspective exploded view of the cover body of the present invention.

Please refer to FIG. 2. According to a preferred embodiment, the heat dissipation structure for communication chassis of the present invention includes an enclosure 2 defining a receiving space 21 and having multiple radiating fins 23 disposed on an outer face of the enclosure 2 opposite to the receiving space 21. The enclosure 2 includes at least one first copper heat absorption component 211 and at least one first heat pipe assembly 213. The first heat pipe assembly 213 is disposed in the receiving space 21 of the enclosure 2 and connected with the first copper heat absorption component 211 and a section 212 not in contact with the first copper heat absorption component 211. The first heat pipe assembly 213 serves to transfer heat absorbed by the first copper heat absorption component 211 to the section 212 to dissipate the heat. The section 212 not in contact with the first copper heat absorption component 211 is an area distal from the first copper heat absorption component 211 without contacting the first copper heat absorption component 211.

The first copper heat absorption component 211 has better thermal conductivity (or heat absorption capability) so that the first copper heat absorption component 211 can quickly absorb heat. The first heat pipe assembly 213 includes multiple first heat pipes 2130 each having at least one first heat absorption end 2131 and at least one first heat dissipation end 2132. The heat absorbed by the first heat absorption end 2131 is transferred to the first heat dissipation end 2132, which dissipates the heat. In other words, the first heat absorption end 2131 serves to quickly transfer the heat absorbed by the first copper heat absorption component 211 to the first heat dissipation end 2132. The first heat dissipation end 2132 then distributively transfers the heat to the section 212 not in contact with the first copper heat absorption component 211 and other sections of the enclosure 2. Accordingly, the first heat pipe assembly 213 serves to effectively and uniformly distributively transfer the heat to the section 212 not in contact with the first copper heat absorption component 211 and other sections of the enclosure 2 to quickly dissipate the heat.

Please refer to FIGS. 2, 3, 4, 5 and 5A. The first copper heat absorption component 211 has a first end face flush with a bottom face of the enclosure 2 and a second end face embedded in the bottom face of the enclosure 2. The first copper heat absorption component 211 is integrally formed with the enclosure 2. The first copper heat absorption component 211 is in contact with at least one heat-generating component 41 to form a hot area H. The first copper heat absorption component 211 absorbs the heat generated by the heat-generating component 41 so that the temperature in the hot area H is higher than the temperature in any other area of the receiving space 21. The first heat absorption end 2131 is adjacent to the first copper heat absorption component 211, while the first heat dissipation end 2132 is distal from the first copper heat absorption component 211.

The enclosure 2 includes a first heat dissipation section 2121, a second heat dissipation section 2122, a third heat dissipation section 2123, a fourth heat dissipation section 2124 and a fifth heat dissipation section 2125, which communicate with each other to form a cold area L. The cold area L is distal from the hot area H and not in contact with any heat-generating component 41. Accordingly, the temperature in the cold area L is lower than the temperature of the hot area H so that the cold area L serves as a heat dissipation area in the receiving space 21 for dissipating the heat. The first, second, third, fourth and fifth heat dissipation sections 2121, 2122, 2123, 2124 and 2125 together form the section 212 not in contact with the first copper heat absorption component 211.

The first heat dissipation section 2121 is disposed on a bottom face of the receiving space 21 and distal from the first copper heat absorption component 211. The second, third, fourth and fifth heat dissipation sections 2122, 2123, 2124 and 2125 are disposed on a periphery of the receiving space 21 in communication with each other. That is, two sides of the second heat dissipation section 2122 are connected with one side of the third heat dissipation section 2123 and one side of the fifth heat dissipation section 2125 respectively. The fourth heat dissipation section 2124 is positioned opposite to the second heat dissipation section 2122 and two sides of the fourth heat dissipation section 2124 are connected with the other side of the third heat dissipation section 2123 and the other side of the fifth heat dissipation section 2125 respectively. Accordingly, the second, third, fourth and fifth heat dissipation sections 2122, 2123, 2124 and 2125 are connected with each other to surround the receiving space 21.

The enclosure 2 has at least one recess 214 formed on an inner face of the enclosure 2 for accommodating the first heat pipe 2130. A first part of the recess 214 is adjacent to the first copper heat absorption component 211, while a second part of the recess 214 is adjacent to the section 212 not in contact with the first copper heat absorption component 211 and is adjacent to a periphery of the enclosure 2. That is, the first part of the recess 214 extends around the first copper heat absorption component 211 along the first heat absorption end 2131 of the first heat pipe 2130, while the second part of the recess 214 is distal from the first copper heat absorption component 211 and extends into contact with the section 212 and the enclosure 2 along the first heat dissipation end 2132 of the first heat pipe 2130.

At least one chassis board 4 is rested in the receiving space 21. The heat-generating component 41 is disposed on the chassis board 4.

Figure 4:
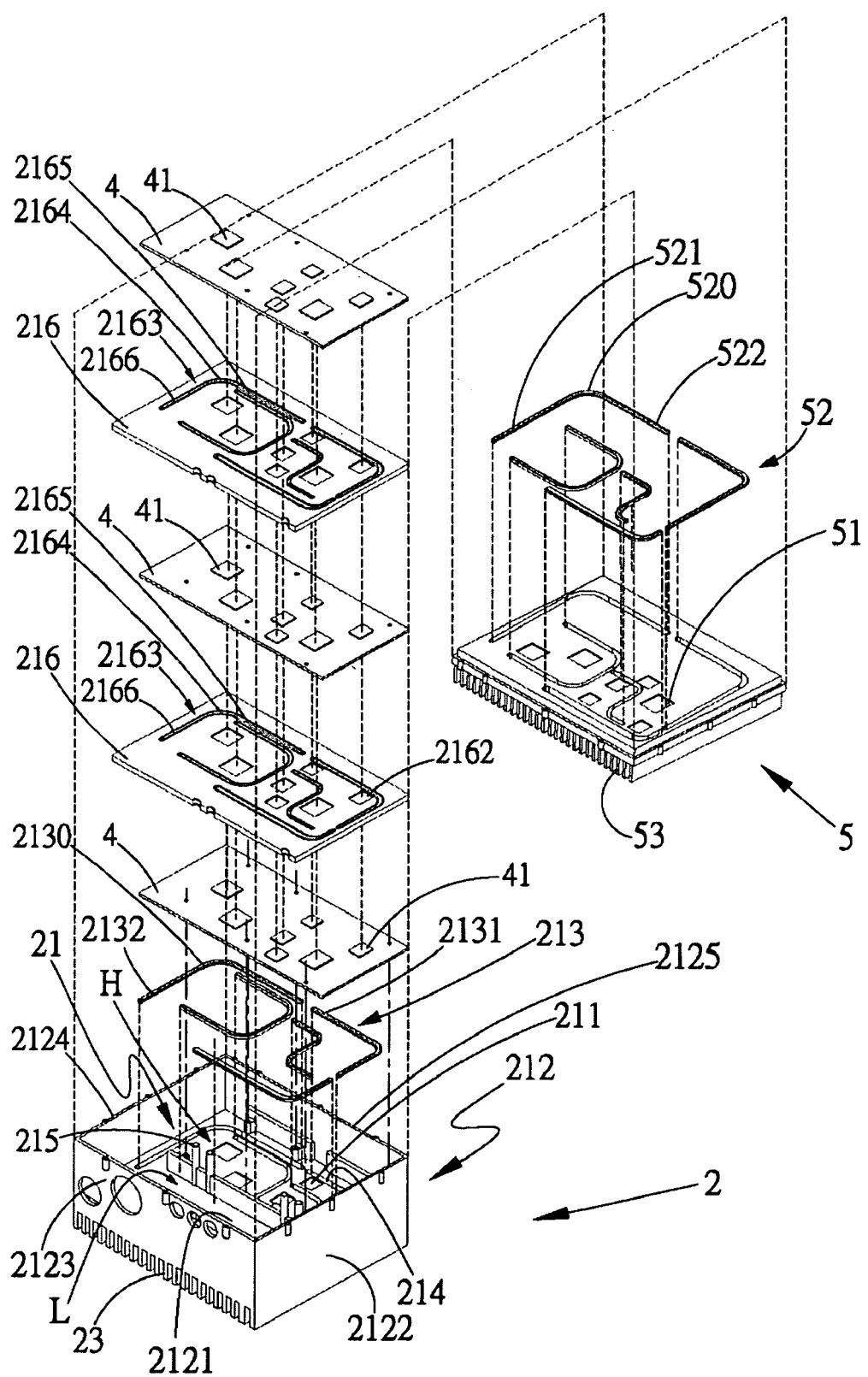
FIG. 4 is a perspective exploded view of a preferred embodiment of the present invention.

Please refer to FIG. 4. The heat dissipation structure of the present invention further includes at least one support element 215 and at least one heat conduction element 216. The support element 215 is disposed in the receiving space 21 of the enclosure 2 for supporting the chassis board 4. The support element 215 on one hand firmly fixes the chassis board 4 in the receiving space 21 and on the other hand conducts heat generated by the chassis board 4 to the enclosure 2. The radiating fins 23 of the enclosure 2 then dissipate the heat by way of radiation.

The heat conduction element 216 is disposed between two adjacent chassis boards 4. One end of the heat conduction element 216 tightly leans against an inner wall of the receiving space 21. Each of two sides of the heat conduction element 216 has at least one second copper heat absorption component 2162, which abuts against the heat-generating component 41 of the chassis board 4 to form the hot area H. The second copper heat absorption component 2162 has better thermal conductivity (or heat absorption capability) so that the second copper heat absorption component 2162 can quickly absorb the heat generated by the heat-generating component 41 of the chassis board 4. The heat conduction element 216 can be a heat spreading board. Two opposite end faces of the second copper heat absorption component 2162 are flush with the surfaces of the heat conduction element 216 and the second copper heat absorption component 2162 is integrally formed with the heat conduction element 216.

The heat conduction element 216 further includes a second heat pipe assembly 2163. The second heat pipe assembly 2163 includes multiple second heat pipes 2164 each having a second heat absorption end 2165 adjacent to the second copper heat absorption component 2162 and a second heat dissipation end 2166 distal from the second copper heat absorption component 2162. The heat absorbed by the second heat absorption end 2165 is transferred through the second heat dissipation end 2166 to the section 212 (the first to fifth heat dissipation sections 2121, 2122, 2123, 2124, 2125) not in contact with the first copper heat absorption component 211 to dissipate the heat. That is, the heat generated by the heat-generating component 41 is absorbed by the second copper heat absorption component 2162 and transferred through the second heat absorption end 2165 to the second heat dissipation end 2166. The second heat dissipation end 2166 then transfers the heat to the section 212, which dissipates the heat by way of radiation. The radiating fins 23 of the enclosure 2 help in dissipating the heat. According to the aforesaid, major part of the heat is dissipated through the first, second, third, fourth and fifth heat dissipation sections 2121, 2122, 2123, 2124 and 2125 by way of radiation and heat exchange with ambient air. Minor part of the heat is dissipated from the radiating fins 23 of the enclosure 2.

Referring to FIG. 4, the enclosure 2 is mated with a cover body 5 having a first face facing the receiving space 21. At least one third copper heat absorption component 51 and at least one third heat pipe assembly 52 are disposed on the first face of the cover body 5. The cover body 5 further has a second face opposite to the first face. Multiple radiating fins 53 are disposed on the second face of the cover body 5. The third copper heat absorption component 51 abuts against (or immediately contacts) the heat-generating component 41 to form the hot area H. The third copper heat absorption component 51 serves to absorb the heat generated by the heat-generating element 41 disposed on the chassis board 4. The third copper heat absorption component 51 is flush with the first face of the cover body 5 and the third copper heat absorption component 51 is integrally formed with the cover body 5.

The third heat pipe assembly 52 includes multiple third heat pipes 520 each having a third heat absorption end 521 adjacent to the third copper heat absorption component 51 and a third heat dissipation end 522 distal from the third copper heat absorption component 51. The heat absorbed by the third heat absorption end 521 is transferred through the third heat dissipation end 522 to the radiating fins 53 of the second face of the cover body 5 and/or the section 212 not in contact with the first copper heat absorption component 211 to dissipate the heat. That is, the third copper heat absorption component 51 with better thermal conductivity is able to quickly absorb the heat generated by the heat-generating component 41 and transfer the heat through the third heat absorption end 521 to the third heat dissipation end 522. The third heat dissipation end 522 then transfers the heat to the section 212 not in contact with the first copper heat absorption component 211 and the radiating fins 53 of the cover body 5 to dissipate the heat.

Figure 5:
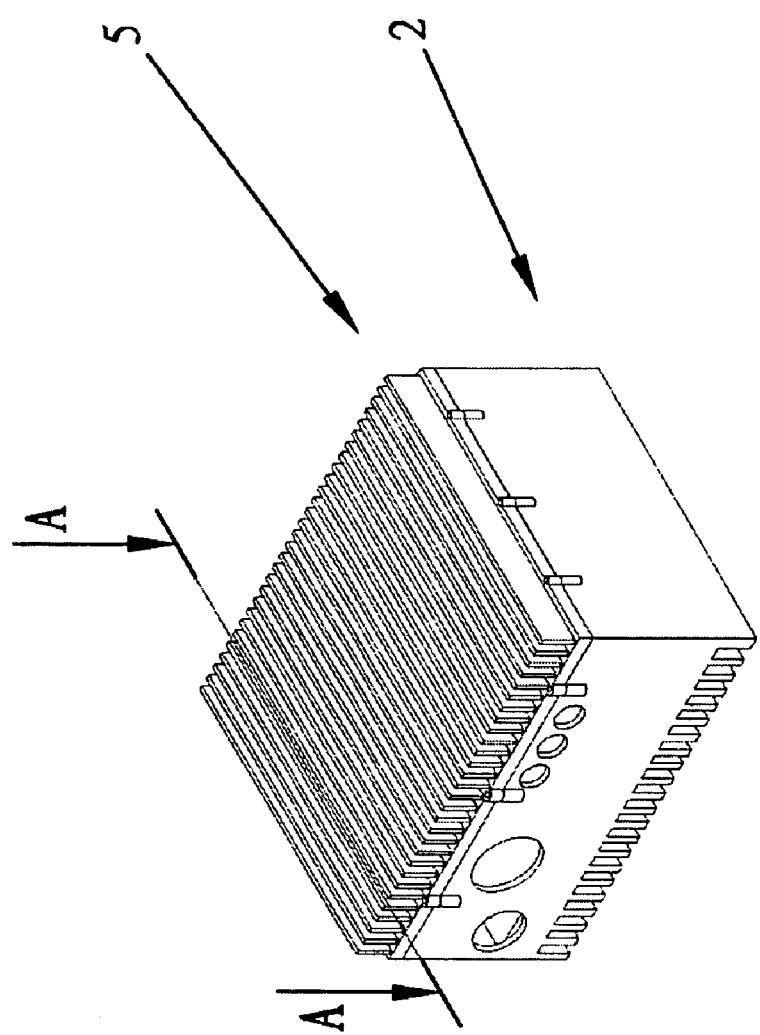
FIG. 5 is a perspective assembled view of the preferred embodiment of the present invention.
Figure 5A:
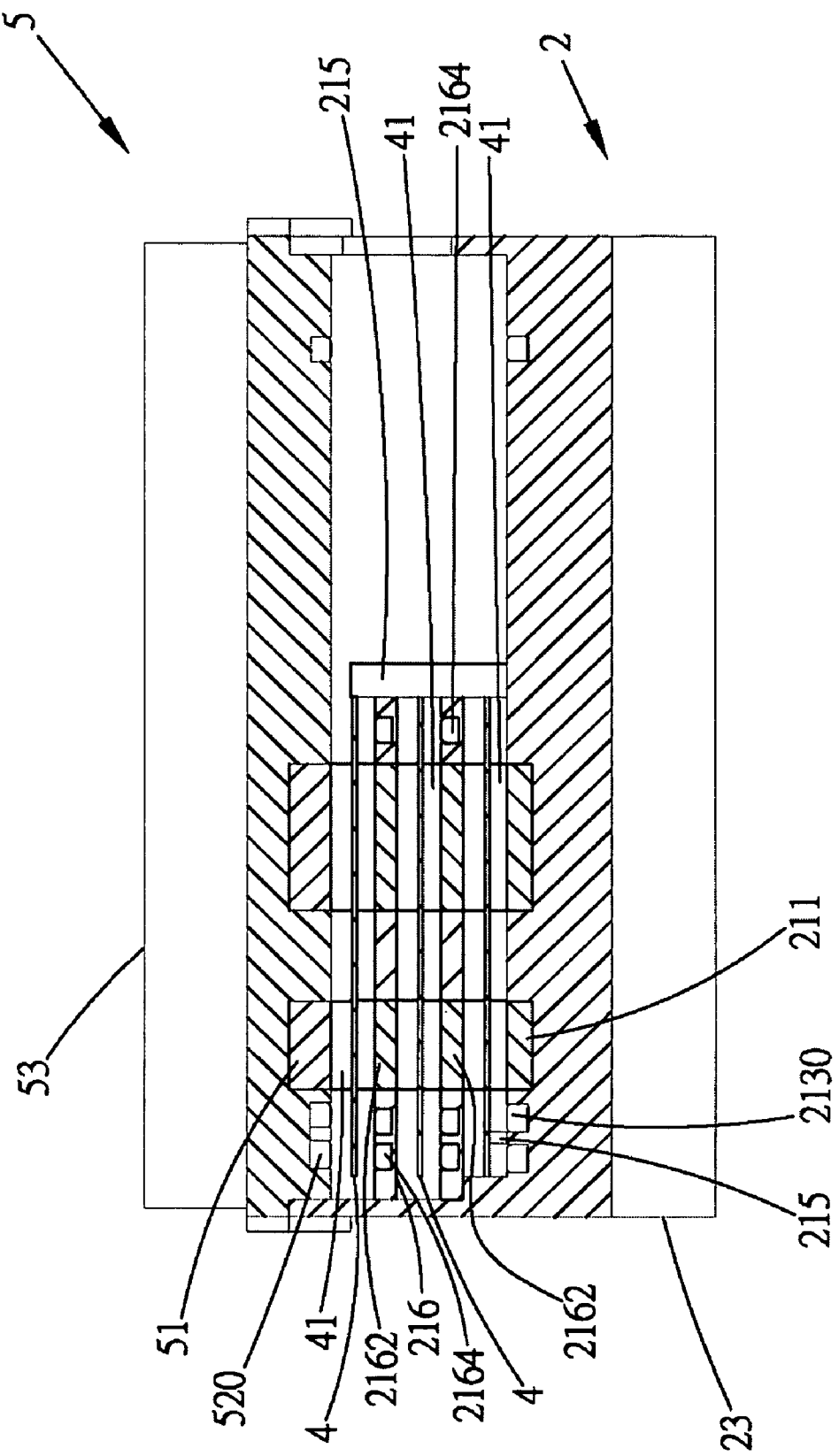
FIG. 5A is a sectional view taken along line A-A of FIG. 5.

Please now refer to FIGS. 4, 5 and 5A, which illustrate the operation of the present invention as follows:

When the chassis board 4 arranged in the communication chassis works, the heat-generating component 41 of the chassis board 4 generates high heat. At this time, the first copper heat absorption component 211 with better thermal conductivity quickly absorbs the heat generated by the heat-generating component 41 of the chassis board 4. The first heat absorption end 2131 of the first heat pipe 2130 transfers the heat to the first heat dissipation end 2132. The first heat dissipation end 2132 further distributively conducts the heat to the section 212 (the first to fifth heat dissipation sections 2121, 2122, 2123, 2124, 2125) not in contact with the first copper heat absorption component 211. The section 212 not in contact with the first copper heat absorption component 211 then dissipates the heat by large heat dissipation area by way of radiation. The radiating fins 23 of the enclosure 2 help in dissipating the heat.

At the same time, the second copper heat absorption components 2162 of two sides of the heat conduction element 216 with better thermal conductivity quickly absorbs the heat generated by the heat-generating components 41 of the corresponding chassis boards 4. The second heat absorption end 2165 of the second heat pipe 2164 transfers the heat to the second heat dissipation end 2166. The second heat dissipation end 2166 further transfers the heat to the section 212 not in contact with the first copper heat absorption component 211. The section 212 not in contact with the first copper heat absorption component 211 then uniformly spreads the heat to the first to fifth heat dissipation sections 2121, 2122, 2123, 2124, 2125, which dissipate the heat by way of radiation. The radiating fins 23 of the enclosure 2 help in dissipating the heat.

Also, the third copper heat absorption component 51 of the cover body 5 quickly absorbs the heat generated by the heat-generating component 41 of another corresponding chassis board 4. The third heat absorption end 521 of the third heat pipe 520 transfers the heat to the third heat dissipation end 522. The third heat dissipation end 522 further transfers the heat to the section 212 not in contact with the first copper heat absorption component 211. The section 212 not in contact with the first copper heat absorption component 211 then quickly spreads the heat to the first to fifth heat dissipation sections 2121, 2122, 2123, 2124, 2125, which dissipate the heat by way of radiation. The radiating fins 53 of the cover body 5 help in dissipating the heat. Therefore, the chassis boards 4 arranged in the communication chassis can stably operate with excellent heat dissipation effect so as to ensure stable quality of communication signals and prolong lifetime of the equipments arranged in the communication chassis.

In conclusion, the heat dissipation structure for communication chassis of the present invention has the following advantages:

1. The heat dissipation structure has better heat conduction effect.
2. The heat dissipation structure has better heat dissipation effect.

3. The heat dissipation structure can more uniformly conduct the heat.
4. The heat dissipation structure provides increased heat dissipation area.
5. The heat dissipation structure ensures stable quality of communication signals.
6. The heat dissipation structure prolongs the lifetime of the equipments arranged in the communication chassis.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation structure for a communication chassis, comprising an enclosure, the enclosure including a first copper heat absorption component and a first heat pipe assembly, the first copper heat absorption component and the first heat pipe assembly being disposed in the enclosure, the first heat pipe assembly being connected to the first copper heat absorption component and the first heat pipe assembly having a section not in contact with the first copper heat absorption component, whereby the first heat pipe assembly transfers heat absorbed by the first copper heat absorption component to the section not in contact with the first copper heat absorption component to dissipate the heat and wherein the first copper heat absorption component has a first end face flush with an inner surface of a bottom face of the enclosure and a second end face embedded in the bottom face of the enclosure, the first copper heat absorption component being integrally formed with the enclosure, and wherein the first copper heat absorption component in contact with and adjacent to at least one heat-generating component to form a hot area.

2. The heat dissipation structure for the communication chassis as claimed in claim 1, wherein the enclosure defines a receiving space.

3. The heat dissipation structure for the communication chassis as claimed in claim 2, wherein the enclosure includes a first heat dissipation section, a second heat dissipation section, a third heat dissipation section, a fourth heat dissipation section and a fifth heat dissipation section, which communicate with each other to form a cold area, the first heat dissipation section being disposed on the bottom face of the receiving space and distal from the first copper heat absorption component, the second, third, fourth and fifth heat dissipation sections being disposed on a periphery of the receiving space in communication with each other.

4. The heat dissipation structure for the communication chassis as claimed in claim 2, wherein at least one chassis board is rested in the receiving space, the at least one heat-generating component being disposed on the at least one chassis board.

5. The heat dissipation structure for the communication chassis as claimed in claim 4, further comprising at least one support element and at least one heat conduction element, the at least one support element being disposed in the receiving space of the enclosure for supporting the at least one chassis board, and the at least one heat conduction element having at least one second copper heat absorption component, which abuts against the at least one heat-generating component of a chassis board of the at least one chassis board to form the hot area.

6. The heat dissipation structure for the communication chassis as claimed in claim 5, wherein two opposite end faces of the at least one second copper heat absorption component are flush with surfaces of the at least one heat conduction element and the at least one second copper heat absorption component is integrally formed with the at least one heat conduction element.

7. The heat dissipation structure for the communication chassis as claimed in claim 5, wherein the at least one heat conduction element includes a second heat pipe assembly, the second heat pipe assembly including multiple second heat pipes each having a second heat absorption end adjacent to the at least one second copper heat absorption component and a second heat dissipation end distal from the at least one second copper heat absorption component, whereby each of the second heat absorption ends absorbs the heat and transfers the heat through each of the second heat dissipation ends to the section not in contact with the first copper heat absorption component to dissipate the heat.

8. The heat dissipation structure for the communication chassis as claimed in claim 2, wherein the enclosure has multiple radiating fins disposed on an outer surface of the bottom face of the enclosure opposite to the receiving space.

9. The heat dissipation structure for the communication chassis as claimed in claim 2, wherein the enclosure is mated with a cover body having a first face facing the receiving space, a third copper heat absorption component being disposed on the first face of the cover body, the cover body further having a second face opposite to the first face, multiple radiating fins being disposed on the second face of the cover body, the third copper heat absorption component abutting against the at least one heat-generating component to form the hot area.

10. The heat dissipation structure for the communication chassis as claimed in claim 9, wherein a surface of the third copper heat absorption component is flush with the first face of the cover body and the third copper heat absorption component is integrally formed with the cover body.

11. The heat dissipation structure for the communication chassis as claimed in claim 9, wherein the cover body has a third heat pipe assembly, the third heat pipe assembly including multiple third heat pipes each having a third heat absorption end adjacent to the third copper heat absorption component and a third heat dissipation end distal from the third copper heat absorption component, each of the third heat absorption ends absorbs the heat and transfers the heat through each of the third heat dissipation ends to the section not in contact with the first copper heat absorption component to dissipate the heat.

12. The heat dissipation structure for the communication chassis as claimed in claim 9, wherein the cover body has a third heat pipe assembly, the third heat pipe assembly including multiple third heat pipes each having a third heat absorption end adjacent to the third copper heat absorption component and a third heat dissipation end distal from the third copper heat absorption component, each of the third heat absorption ends absorbing the heat and transferring the heat through each of the third heat dissipation ends to one of the radiating fins of the cover body and the section of the first heat pipe not in contact with the first copper heat absorption component to dissipate the heat.

13. The heat dissipation structure for the communication chassis as claimed in claim 1, wherein the first heat pipe assembly includes multiple first heat pipes each having a first heat absorption end and a first heat dissipation end, each of the first heat absorption ends being adjacent to the first copper heat absorption component, and each of the first heat dissipation ends being distal from the first copper heat absorption component.

14. The heat dissipation structure for the communication chassis as claimed in claim 1, wherein the enclosure has at least one recess formed in the bottom face of the enclosure for accommodating the first heat pipe assembly, a first part of the at least one recess being adjacent to the first copper heat absorption component, and a second part of the at least one recess being adjacent to the section not in contact with the first copper heat absorption component and the second part of the at least one recess being adjacent to a periphery of the enclosure.

15. The heat dissipation structure for the communication chassis as claimed in claim 1, wherein the enclosure defines a receiving space, at least one chassis board being rested in the receiving space, the at least one heat-generating component being disposed on the at least one chassis board.

* * * * *